United States Patent
Lee et al.

(10) Patent No.: US 7,817,392 B2
(45) Date of Patent: Oct. 19, 2010

(54) INSULATED GATE BIPOLAR TRANSISTOR FAULT PROTECTION SYSTEM

(75) Inventors: Jun-Bae Lee, Seoul (KR); Dae-Woong Chung, Bucheon (KR); Bum-Seok Suh, Bucheon (KR)

(73) Assignee: Fairchild Korea Semiconductor, Ltd., Bucheon-Si (KR)

( * ) Notice: Subject to any disclaimer, the term of this patent is extended or adjusted under 35 U.S.C. 154(b) by 252 days.

(21) Appl. No.: 11/986,615

(22) Filed: Nov. 21, 2007

(65) Prior Publication Data

US 2008/0212247 A1  Sep. 4, 2008

(30) Foreign Application Priority Data

Nov. 21, 2006  (KR) ............... 10-2006-0115186

(51) Int. Cl.
  *H02H 3/00* (2006.01)
(52) U.S. Cl. ..................................... 361/89
(58) Field of Classification Search ............. 361/89
  See application file for complete search history.

(56) References Cited

U.S. PATENT DOCUMENTS

| 5,448,441 | A  | * | 9/1995  | Raposa .................. 361/18 |
| 5,467,242 | A  | * | 11/1995 | Kiraly ................... 361/94 |
| 5,559,656 | A  |   | 9/1996  | Chokhawala |
| 5,764,466 | A  |   | 6/1998  | Mangtani et al. |
| 5,909,112 | A  | * | 6/1999  | Kiyota et al. ............ 323/315 |
| 6,097,582 | A  | * | 8/2000  | John et al. ............... 361/79 |
| 6,275,093 | B1 | * | 8/2001  | Shekhawat et al. ........ 361/18 |
| 7,463,079 | B2 | * | 12/2008 | De et al. ................ 327/379 |
| 2004/0252435 | A1 | * | 12/2004 | Ishikawa et al. .......... 361/100 |
| 2005/0254184 | A1 | * | 11/2005 | Fukui ................... 361/18 |

OTHER PUBLICATIONS

Jun-Bae Lee et al., "Gate Voltage Pattern Analyzer for Short-Circuit Protection in IGBT Inverters," 4 pages, Bucheon-Si, Korea.

* cited by examiner

*Primary Examiner*—Jared J Fureman
*Assistant Examiner*—Ann T Hoang
(74) *Attorney, Agent, or Firm*—Sidley Austin LLP

(57) ABSTRACT

An Insulated Gate Bipolar Transistor (IGBT) fault protection system is provided. The fault protection system includes a GVPA, a gate voltage clamper, and a soft-off unit. The GVPA analyzes a gate voltage pattern of an IGBT to determine whether or not a fault has occurred. The gate voltage clamper prevents an increase in a gate voltage of the IGBT according to an output signal that the GVPA outputs when a fault has occurred. The soft-off unit softly turns off the IGBT according to an output signal that the GVPA outputs when a fault has occurred.

9 Claims, 5 Drawing Sheets

INSULATED GATE BIPOLAR TRANSISTOR FAULT PROTECTION SYSTEM

CROSS-REFERENCE TO RELATED APPLICATION

This application claims priority to and the benefit of Korean Patent Application No. 10-2006-0115186 filed in the Korean Intellectual Property Office on Nov. 21, 2006, the entire content of which is incorporated herein by reference.

BACKGROUND

1. Field of the Invention

The present invention relates to a system for protecting an Insulated Gate Bipolar Transistor (IGBT) against faults such as a short-circuit fault and a fault under load.

2. Description of the Related Art

Devices for power control and conversion use power transistors. It is possible to accomplish power control or conversion by switching on or off such power control transistors at predetermined intervals. These elements are selected so as to reliably handle circuit currents not only under normal conditions but also under overload conditions. However, the elements may be affected by very high surge currents under fault conditions such as a short-circuit fault or a Fault Under Load (FUL). To prevent this, it is necessary to properly control and remove fault currents.

Especially in the case of an IGBT power transistor, currents 10 times higher than the rated level of the transistor may flow in it under serious fault conditions. To prevent high power loss and destruction of the IGBT caused by such short-circuit currents, appropriate fault correction must be performed in a short time such as microseconds. A number of approaches have been suggested to protect the IGBT. For example, typical methods use a sensing IGBT, an emitter resistor, and a high voltage diode. Although these methods are widely used currently, it is not easy to integrate the high power elements, the sensing IGBT, and the like into a gate drive integrated circuit.

SUMMARY

Embodiments of the present invention include an Insulated Gate Bipolar Transistor (IGBT) fault protection system comprising: a Gate Voltage Pattern Analyzer (GVPA) for analyzing a gate voltage pattern of an IGBT to determine whether or not a fault has occurred; a gate voltage clamper for preventing an increase in a gate voltage of the IGBT according to an output signal that the GVPA outputs when a fault has occurred; and a soft-off unit for softly turning off the IGBT according to an output signal that the GVPA outputs when a fault has occurred.

The IGBT fault protection system may further comprise a time delayer for transferring an output signal from the GVPA to the soft-off unit with a predetermined time delay.

The IGBT fault protection system may further comprise a buffer blocker for deactivating a buffer that buffers a gate input signal to the IGBT according to an output signal that the GVPA outputs when a fault has occurred.

The GVPA may include a comparator for receiving the gate voltage of the IGBT to determine whether or not a fault has occurred; and an SR latch for outputting a high signal when it is determined that a fault has occurred according to an output of the comparator.

The comparator may include a first comparator for determining whether or not a short-circuit fault of the IGBT has occurred; and a second comparator for determining whether or not a fault under load of the IGBT has occurred.

The first and second comparators may include an operational amplifier (op amp).

A buffer and a resistor may be provided between a gate driver and a gate of the IGBT. In this case, a gate signal between the resistor and the gate may be input to an inverting terminal of the first comparator and a divided gate signal obtained through division of a gate signal between the buffer and the resistor by first and second resistors may be input to a non-inverting terminal of the first comparator, and the gate signal between the buffer and the resistor may be input to a non-inverting terminal of the second comparator and a divided gate signal obtained through division of the gate signal between the resistor and the gate by third and fourth resistors may be input to an inverting terminal of the second comparator.

The IGBT fault protection system may comprise an OR gate for receiving and inputting outputs of the first and second comparators to an S input terminal of the SR latch.

The IGBT fault protection system may further comprise an inverter for receiving and inverting the gate signal between the buffer and the resistor and inputting the inverted gate signal to an R input terminal of the SR latch.

The gate voltage clamper may include a Zener diode having a cathode connected to the gate of the IGBT; and a transistor having a collector connected to an anode of the Zener diode, an emitter grounded, and a gate connected to an output terminal of the GVPA.

The soft-off unit may include a high resistor connected to the gate of the IGBT; and a transistor having a collector connected to the high resistor, an emitter grounded, and a gate connected to an output terminal of the GVPA.

DETAILED DESCRIPTION

Figure 1:
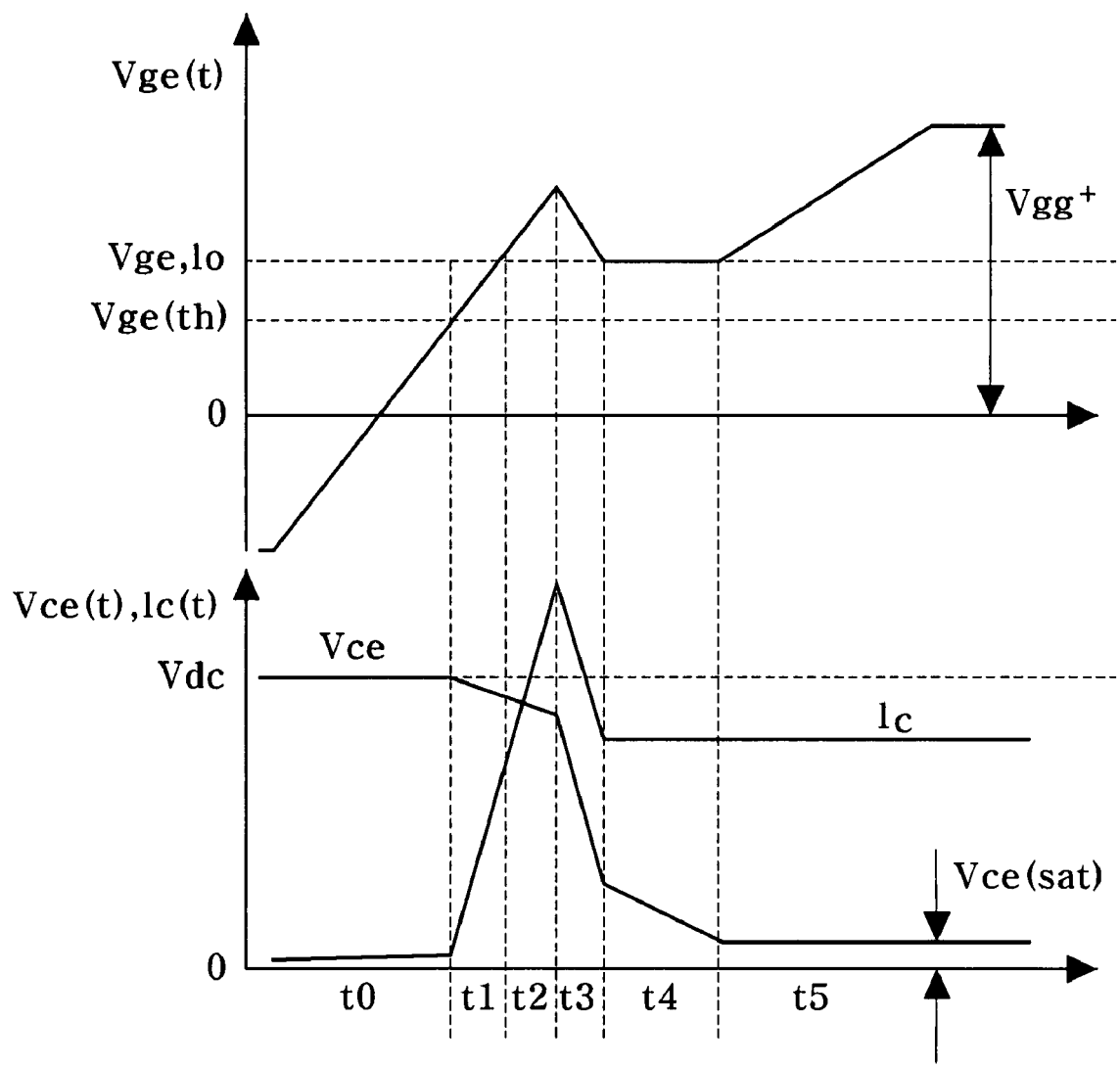
FIG. 1 is a graph showing switching waveforms of an Insulated Gate Bipolar Transistor (IGBT).

FIG. 1 is a graph showing switching waveforms of an Insulated Gate Bipolar Transistor (IGBT). When the IGBT is used as a switching element in a circuit having an inductive load, the gate current can charge parasitic input capacitances Cge and Cgc. Simultaneously, the gate-emitter voltage Vge can increase up to the gate threshold voltage Vge(th) in a first time interval t0. The increasing gate-emitter voltage Vge has an exponential time dependence with a time constant Rg(Cge+Cgc). This time-evolution is well-approximated with a linear form in the relevant time window, as shown in FIG. 1. In the time interval t0 the collector-emitter voltage Vce and the collector current Ic are essentially unchanged. Most of the so-called turn-on delay occurs in this time interval. This turn-on delay is defined as the time from when the gate voltage Vge reaches 10% of the maximum gate voltage Vgg+ to when the collector current Ic reaches 10% of the full load current Io.

When entering a second time interval t1, the gate-emitter voltage Vge can exceed the gate threshold voltage Vge(th), which causes a channel to be formed on the p-base region under the gate insulated layer and to allow current to start flowing through it. In this time interval, the IGBT can enter an active phase and the collector current Ic can increase according to the gate-emitter voltage Vge. In this time interval, the collector current Ic can gradually increase to finally reach essentially the full load current Io. In second and third time intervals t1 and t2, the collector-emitter voltage Vce can decrease in proportion to the stray inductance Lc and the collector current's time derivative, dIc/dt, whereas the collector current Ic continues increasing according to the reverse recovery current of a free-wheeling diode.

The reverse recovery current of the free-wheeling diode starts flowing in the third time interval, increasing in the third time interval t2 and decreasing in the fourth time interval t3. In this same fourth time interval t3, the voltage across the free-wheeling diode can increase, whereas the collector-emitter voltage Vce can drop. If the gate-collector capacitance Cgc is low and the DC voltage Vdc is high enough, the collector-emitter voltage Vce can decrease sharply. In the fourth time interval t3, both the gate-collector capacitance Cgc and the gate-emitter capacitance Cge can discharge. The reverse recovery of the diode can terminate at the end of the fourth time interval t3.

In a fifth time interval t4, the gate current Ig can charge the gate-emitter capacitance Cge. The gate-emitter voltage Vge can maintain essentially the full load gate-emitter voltage Vge, Io, and the collector current Ic can maintain the full load current Io. On the other hand, the collector-emitter voltage Vce can drop with a ratio of (Vgg−Vge,Io)/(RgCgc). In a sixth time interval t5, the gate-emitter voltage Vge can increase with a time constant Rg(Cge+Cgc,miller) until it reaches the maximum gate voltage Vgg+. Here, Cgc,miller denotes a gate-collector capacitance Cgc that is generated from a low collector-emitter voltage Vce by the Miller effect. In this time interval, the collector-emitter capacitance Cgc can gradually decrease until it reaches the on-state level of the collector-emitter voltage so that it is completely saturated.

Figure 2:
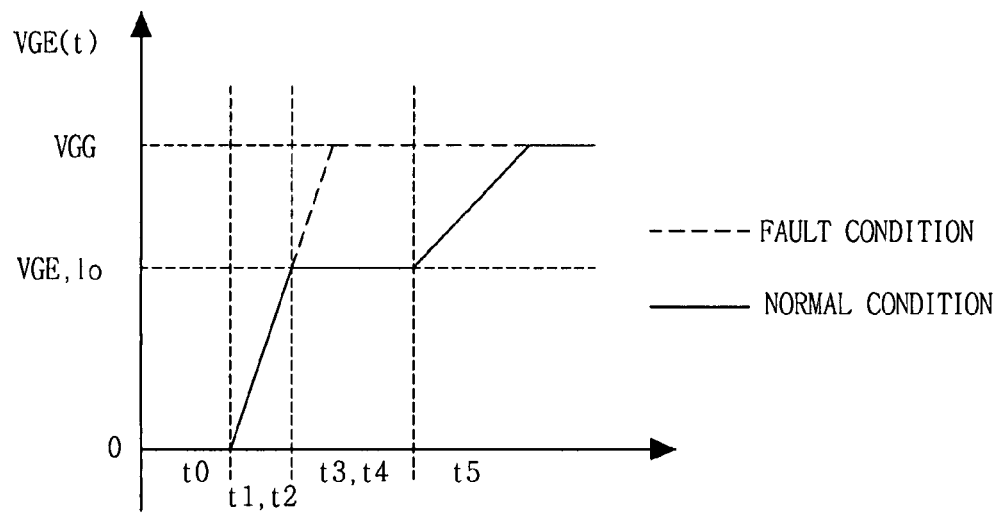
FIG. 2 is a graph illustrating a comparison of gate voltage waveforms under a normal condition and a short-circuit fault condition.

FIG. 2 is a graph illustrating the waveform of gate voltage Vge under a normal condition and a short-circuit fault condition. The waveform of gate voltage Vge under the normal and short-circuit fault conditions are different in the fourth and fifth time intervals t3 and t4. Specifically, the gate voltage Vge can remain constant under the normal condition as denoted by a solid line, while the gate voltage Vge is not constant under the short-circuit fault condition as denoted by a dashed line. In the fourth and fifth time intervals t3 and t4, the gate voltage Vge is constant due to the Miller effect as described above with reference to FIG. 1. However, the gate voltage is not constant in intervals t3 and t4 under the short-circuit fault condition since the collector-emitter voltage Vce of the IGBT is not changed under the short-circuit fault condition.

Figure 3:
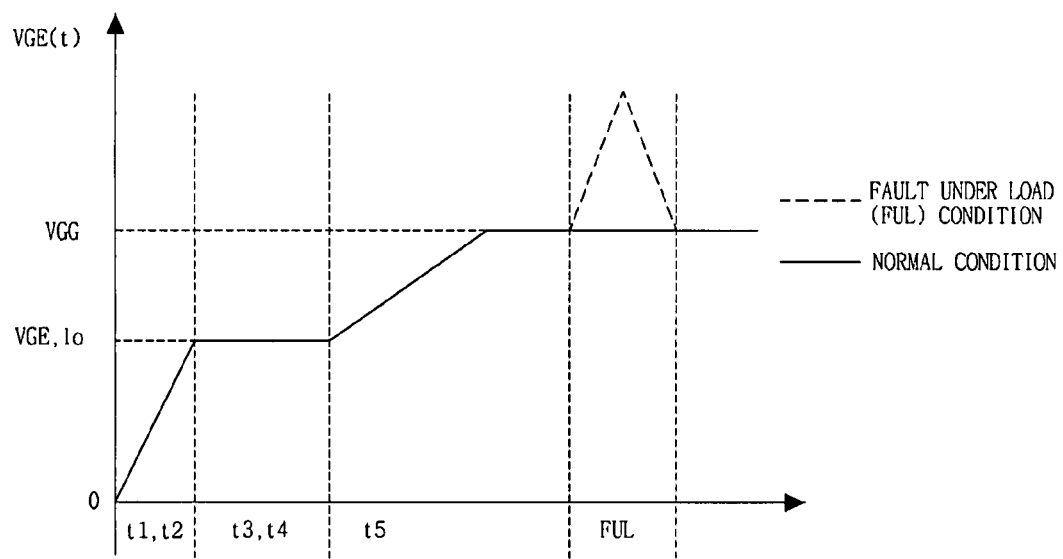
FIG. 3 is a graph illustrating a comparison of gate voltage waveforms under a normal condition and a fault under load (FUL) condition.

FIG. 3 is a graph illustrating a comparison of waveform of the gate voltage Vge under a normal condition and a fault under load (FUL) condition. The waveform of the gate voltage Vge under the FUL condition is different from that under the normal condition after the sixth time interval t5 (denoted as an FUL interval), which is slightly different from the case of the waveform of the gate voltage Vge under the short-circuit fault condition. Specifically, in the FUL interval, the gate voltage Vge is essentially constant under the normal condition as denoted by a solid line, while the gate voltage Vge is not constant under the FUL condition as denoted by a dashed line. The level of the collector-emitter voltage Vce before a short circuit occurs is low since the fault under load corresponds to the occurrence of the short circuit when the device is on. If an opposite-side IGBT is turned on while the test circuit device is kept on in the FUL test circuit, a short circuit occurs, which causes a shoot-through current to flow. That is, the current sharply increases and the IGBT leaves a full conducting state and enters an active interval. In this interval, the collector-emitter voltage Vce can increase and the gate-collector current Igc may start flowing into the gate-collector capacitance Cgc, which is a Miller capacitance. If the gate resistance is high, the corresponding voltage may reach a level above the maximum gate voltage Vgg+. When the gate-emitter voltage Vge is equal to the maximum gate voltage Vgg+, the fault current is increased above the rated current so that the breakdown probability of the device is greatly increased. One means for suppressing the fault under load is to use a low gate resistance. The low gate resistance may prevent the gate-emitter voltage Vge from increasing so as to limit the short-circuit current during the fault under load.

Figure 4:
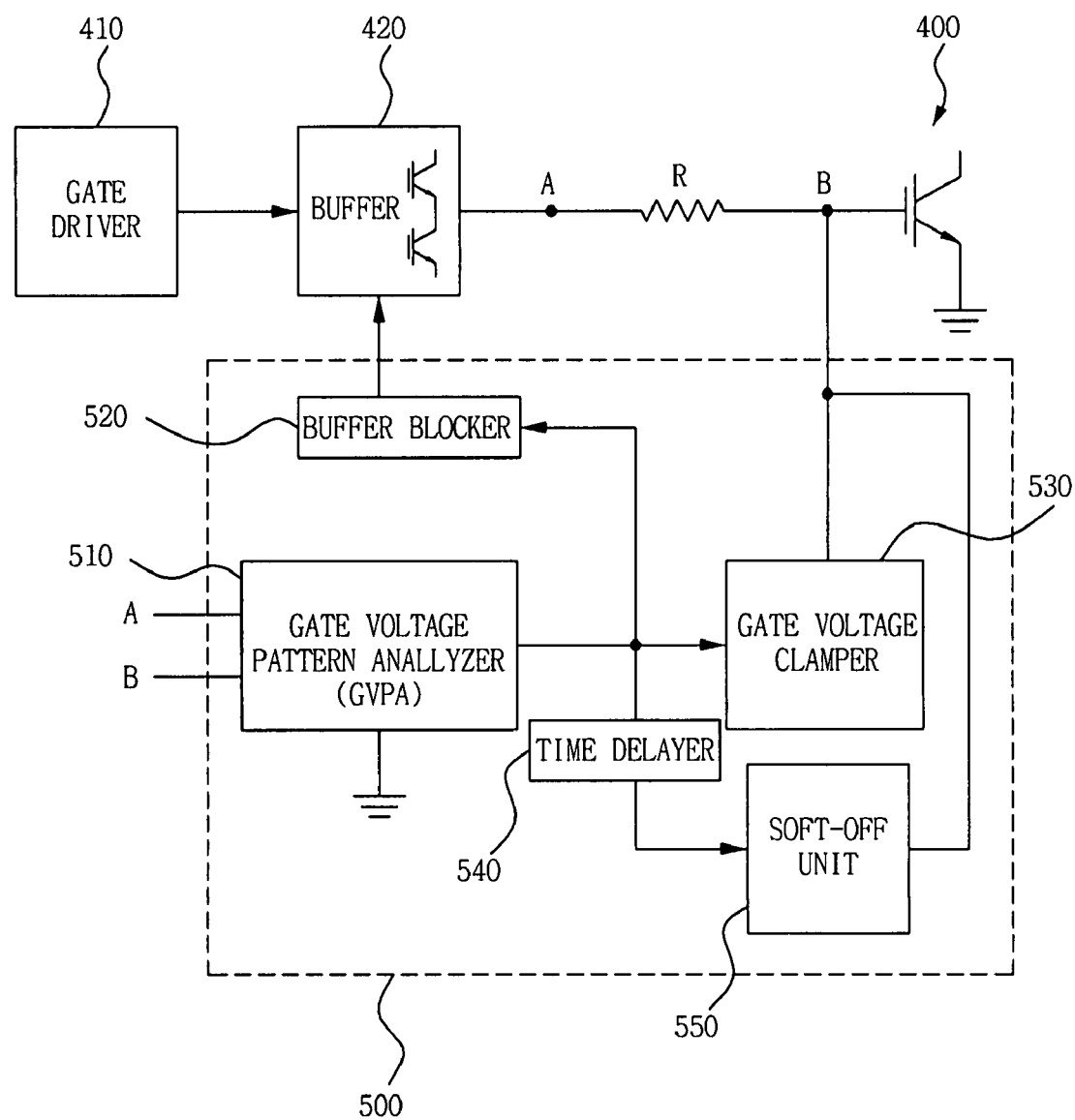
FIG. 4 illustrates an IGBT fault protection system according to the present invention.

FIG. 4 illustrates an IGBT fault protection system. An IGBT 400 may receive a signal from a gate driver 410. A buffer 420 and a resistor R are coupled between the gate driver 410 and a gate of the IGBT 400. The gate driver 410 may generate a gate signal of the IGBT 400. The buffer 420 can buffer a signal from the gate driver 410. The buffer 420 can include at least two switching elements to accomplish the buffering. A gate voltage output from the buffer 420 is input to the gate of the IGBT 400 through the resistor R.

A fault protection system 500 of the IGBT includes a Gate Voltage Pattern Analyzer (GVPA) 510, a buffer blocker 520, a gate voltage clamper 530, a time delayer 540, and a soft off unit 550. The GVPA 510 may receive gate signals from terminals "A" and "B" at both ends of the resistor R and output a high or low signal depending on whether or not a fault has occurred. The buffer blocker 520 can receive an output signal of the GVPA 510. The buffer blocker 520 can deactivate the buffer 420 when receiving a high signal indicating that a fault has occurred. The gate voltage clamper 530 can also receive the output signal of the GVPA 510. The gate voltage clamper 530 can prevent the gate voltage from continuously increasing when receiving a high signal indicating that a fault has occurred. The time delayer 540 may output the output signal of the GVPA 510 with a predetermined time delay. The soft-off unit 550 can softly turn off the IGBT 400 according to the high output signal of the GVPA 510, delayed by the time delayer 540 by a predetermined time.

The following is a more detailed description of the fault protection operation of the fault protection system 500. The GVPA 510 can receive gate signals from terminals "A" and "B" of the resistor R and determine whether the current state is a fault state or normal. This process will be described in more detail later. If the GVPA 510 determines that the current state is in a fault state, the GVPA 510 may generate a high signal, which is input to the buffer blocker 520, the gate voltage clamper 530, and the soft-off unit 550. In response, the buffer blocker 520 may deactivate the buffer 420 and the gate voltage clamper 530 may prevent an increase in the gate voltage. With a predetermined time delay through the time delayer 540, the soft-off unit 550 may gradually decrease the gate voltage to turn off the IGBT 400. If the GVPA 510 determines that the current state is normal, the GVPA 510 outputs a low signal rather than the high signal. When receiving the low signal, the buffer blocker 520, the gate voltage clamper 530, and the soft-off unit 550 can be deactivated to allow the IGBT 400 to operate normally without substantial loss.

Figure 5:
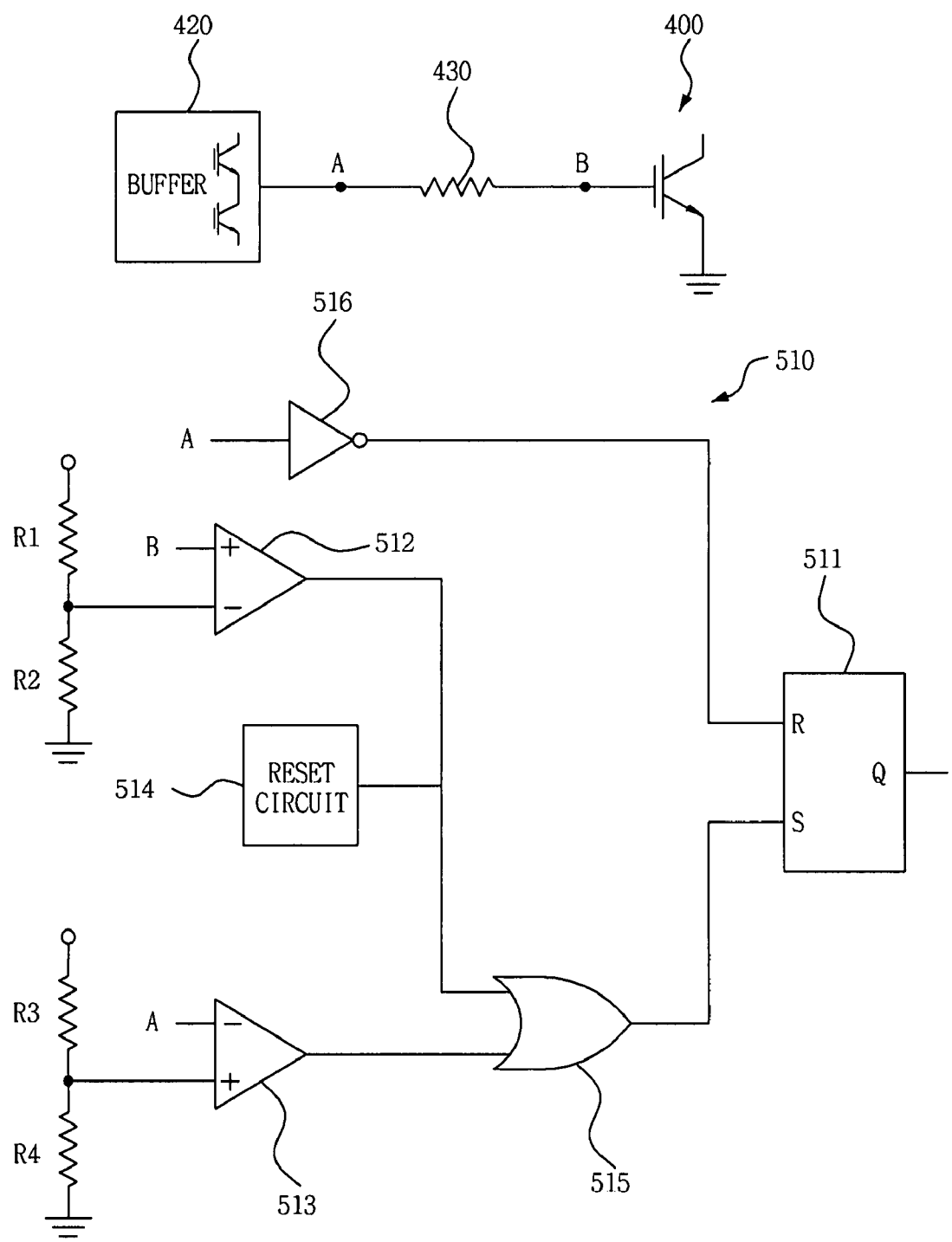
FIG. 5 is a circuit diagram illustrating an example of a Gate Voltage Pattern Analyzer (GVPA) of FIG. 4.

FIG. 5 is a circuit diagram illustrating an example of the Gate Voltage Pattern Analyzer (GVPA) 510 of FIG. 4. The GVPA 510 may include one SR latch 511 and two comparators 512 and 513. The first comparator 512 is capable of detecting a short-circuit fault and the second comparator 513 is capable of detecting a fault under load. The first and second comparators 512 and 513 may include an op amp. The gate signal from the terminal "B" between the gate of the IGBT 400 and the resistor R can be input to a non-inverting terminal (+) of the first comparator 512. A gate signal from the terminal "A" between the buffer 420 and the resistor R, divided via first and second resistors R1 and R2, may be input to an inverting terminal (−) of the first comparator 512. The gate signal from the terminal "A" may also be input to an inverting terminal (−) of the second comparator 513. A gate signal from the terminal "B", divided via third and fourth resistors R3 and R4, may also be input to a non-inverting terminal (+) of the second comparator 513. The resistances of the first and second resistors R1 and R2 can be chosen such that the level of the gate signal, divided via the first and second resistors R1 and R2, limits a first overcurrent level. Similarly, the resistances of the third and fourth resistors R3 and R4 can be chosen such that the level of the gate signal, divided via the third and fourth resistors R3 and R4, limits a second overcurrent level.

An output signal of the first comparator 512 and an output signal of the second comparator 513 can be input to input terminals of an OR gate 515. A reset circuit 514 may be connected to one of the input terminals of the OR gate 515 and may input a reset input signal to the OR gate 515 according to circumstances. An output terminal of the OR gate 515 may be connected to an S input terminal of the SR latch 511. An inverter 516 can be connected to an R input terminal of the SR latch 511 and the gate signal at the terminal "A" may be input to the inverter 516. A Q output terminal of the SR latch 511 may generate an output signal of the GVPA 510.

When the IGBT 400 is off, the gate signal at the terminal "A" is low so that a high signal is input to the R input terminal of the SR latch 511 through the inverter 516. This resets the SR latch 511 to output a low signal through the Q output terminal. Accordingly, when the IGBT 400 is off, the buffer blocker 520, the gate voltage clamper 530, and the soft-off unit 550 are deactivated. When the IGBT 400 is on, the gate signal at the terminal "A" is high so that a low signal is input to the R input terminal of the SR latch 511 through the inverter 516. Accordingly, when the IGBT 400 is on, the output signal from the Q output terminal of the SR latch 511 depends on the input signal to the S input terminal of the SR latch 511.

The SR latch 511 outputs a high signal through the Q output terminal if the input signal to the S input terminal is high and outputs a low signal if the input signal to the S input terminal is low. Accordingly, a high signal is input to the S input terminal of the SR latch 511 when a short-circuit fault or a fault under load has occurred. First, the case of a short-circuit fault will be described. When the IGBT is turned on, the first comparator 512 may compare the gate voltage at the terminal "B" with the divided voltage of the gate voltage of the terminal "A" during the second to fifth time intervals t1 to t4. As described above, the level of the divided voltage of the gate voltage of the terminal "A" may be set so as to limit the specific overcurrent level since the gate voltage level of the IGBT increases due to the Miller effect during the fourth and fifth time intervals t3 and t4 as the output current of the IGBT increases. Accordingly, when the gate voltage at the terminal "B" is higher than the divided gate voltage of the terminal "A", the input signal to the S input terminal of the SR latch 511 can change from low to high and the SR latch 511 outputs a high signal through the Q output terminal. This high signal output may prevent a further increase in the gate voltage since the Q output terminal of the SR latch 511 is the output terminal of the GVPA 510. The reset circuit 514 may operate to maintain the output state of the SR latch 511 after the fifth time interval t5. If the IGBT 400 is turned off after a predetermined time elapses, then the Q output terminal of the SR latch 511 reset to low.

Next, the case of the fault under load after the fifth time interval t4 will be described. The second comparator 513 may compare the gate voltage at the terminal "A" with the gate voltage at the terminal "B" divided via the third and fourth resistors R3 and R4. If the divided voltage of the terminal "B" is higher than the voltage at the terminal "A" according to (Cgc×dv/dt) effects of the fault under load, the S input terminal of the SR latch 511 changes from low to high. This switches the Q output terminal of the SR latch 511 to high.

Figure 6:
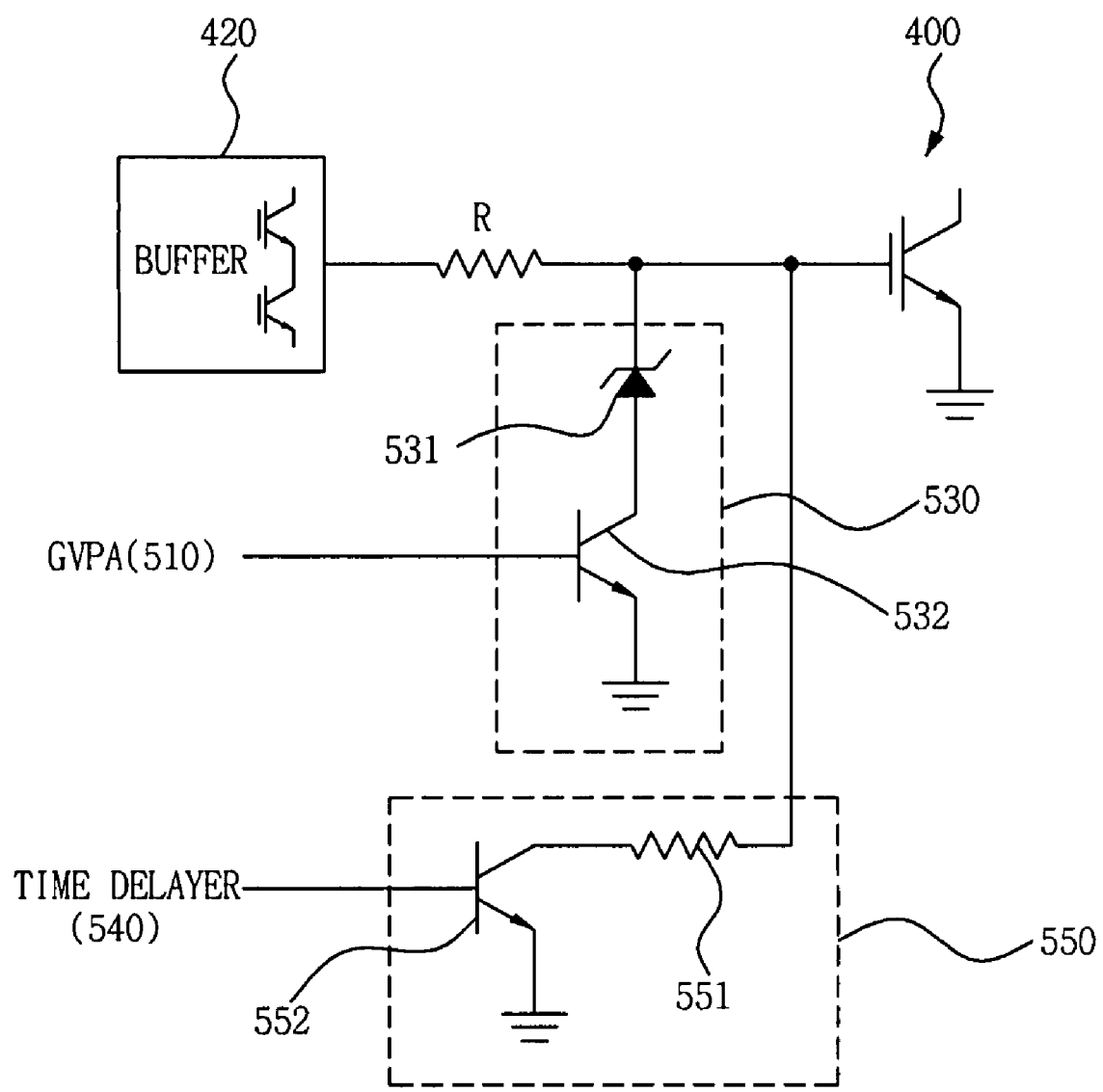
FIG. 6 is a circuit diagram illustrating an example of a gate voltage clamper and a soft-off unit of FIG. 4.

FIG. 6 is a circuit diagram illustrating an embodiment of the gate voltage clamper and the soft-off unit of FIG. 4. The gate voltage clamper 530 may include a Zener diode 531 and a transistor 532. The cathode of the Zener diode 531 can be connected between the gate of the IGBT 400 and the resistor R and its anode can be connected to a collector of the transistor 532. An emitter of the transistor 532 can be grounded and a gate of the transistor 532 receives a signal from an output terminal of the GVPA 510. When a short-circuit fault or a fault under load has occurred to cause the GVPA 510 to input a high signal to the gate of the transistor 532, the transistor 532 can be turned on to activate the Zener diode 531. This activation prevents a further increase in the gate voltage Vge of the IGBT and causes a decrease in the fault current of the IGBT 400.

The soft-off unit 550 may include a resistor 551 with a high resistance and a transistor 552. One end of the resistor 551 can be connected between the resistor R and the gate of the IGBT 400 and the other end can be connected to a collector of the transistor 552. An emitter of the transistor 552 can be grounded and the gate can receive a signal from the time delayer 540. When a short-circuit fault or a fault under load has occurred to cause the GVPA 510 to generate and input a high signal to the gate of the transistor 532 through the time delayer 540, the transistor 552 may be turned on and accordingly the IGBT 400 may be softly turned off due to the resistor 551 with a high resistance.

As is apparent from the above description, the present invention provides an Insulated Gate Bipolar Transistor (IGBT) fault protection system that has a variety of advantages. For example, the IGBT fault protection system may not require an emitter resistor, a high voltage diode, and the like since the system analyzes a gate voltage pattern to cope with a short-circuit fault or a fault under load. In addition, the IGBT fault protection system can be easily incorporated into a gate drive integrated circuit or a high voltage integrated circuit since the IGBT fault protection system is composed of logic elements or low voltage elements.

Although embodiments of the present invention have been disclosed for illustrative purposes, those skilled in the art will appreciate that various modifications, additions and substitutions are possible without departing from the scope and spirit of the invention as disclosed in the accompanying claims.

What is claimed is:

1. An Insulated Gate Bipolar Transistor (IGBT) fault protection system comprising:

a Gate Voltage Pattern Analyzer (GVPA) configured to analyze a gate voltage pattern of an IGBT to determine whether or not a fault has occurred, wherein the GVPA comprises:
   a first comparator configured to determine whether or not a short-circuit fault of the IGBT has occurred; and
   a second comparator configured to determine whether or not a fault under load of the IGBT has occurred;
a gate voltage clamper configured to prevent a substantial increase in a gate voltage of the IGBT according to an output signal that the GVPA outputs when a fault has occurred; and
a soft-off unit configured to softly turn off the IGBT according to a GVPA output signal that the GVPA outputs when a fault has occurred;
wherein the fault protection system is implemented in an integrated circuit;
a buffer and a resistor, coupled between a gate driver and a gate of the IGBT;
a first terminal between the resistor and the gate, coupled to a non-inverting terminal of the first comparator; and
a second terminal between the buffer and the resistor, coupled via a first and a second resistor to an inverting terminal of the first comparator; wherein
the second terminal is coupled to an inverting terminal of the second comparator; and
the first terminal is coupled via a third and a fourth resistor to a non-inverting terminal of the second comparator.

2. The IGBT fault protection system according to claim 1, further comprising:
   a time delayer configured to transfer the GVPA output signal with a predetermined time delay.

3. The IGBT fault protection system according to claim 1, further comprising:
   a buffer, configured to buffer a gate input signal to the IGBT; and
   a buffer blocker for deactivating the buffer according to the GVPA output signal.

4. The IGBT fault protection system according to claim 1, wherein the GVPA comprises:
   an SR latch for outputting a high signal when at least one of the first and the second comparators determines that a fault has occurred.

5. The IGBT fault protection system according to claim 1, wherein the first and second comparators include an op amp.

6. The IGBT fault protection system according to claim 1, further comprising:
   an OR gate, configured to receive outputs of the first and second comparators; and
   having an output coupled to an S input terminal of the SR latch.

7. The IGBT fault protection system according to claim 4, further comprising:
   an inverter configured to receive and invert the gate signal from the second terminal and to input the inverted gate signal to an R input terminal of the SR latch.

8. The IGBT fault protection system according to claim 1, wherein the gate voltage clamper comprises:
   a Zener diode having a cathode connected to a gate of the IGBT; and
   a transistor having a collector connected to an anode of the Zener diode, an emitter grounded, and a gate connected to an output terminal of the GVPA.

9. The IGBT fault protection system according to claim 1, wherein the soft-off unit includes:
   a resistor connected to a gate of the IGBT; and
   a transistor having a collector connected to the resistor, an emitter grounded, and a gate connected to an output terminal of the GVPA.

* * * * *